United States Patent
Yamada

(10) Patent No.: US 8,933,485 B2
(45) Date of Patent: Jan. 13, 2015

(54) COMPOUND SEMICONDUCTOR DEVICE AND METHOD OF MANUFACTURING THE SAME

(75) Inventor: Atsushi Yamada, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/549,660

(22) Filed: Jul. 16, 2012

(65) Prior Publication Data

US 2013/0069113 A1 Mar. 21, 2013

(30) Foreign Application Priority Data

Sep. 16, 2011 (JP) ................................. 2011-203582

(51) Int. Cl.
| | |
|---|---|
| *H01L 29/778* | (2006.01) |
| *H01L 29/66* | (2006.01) |
| *H01L 21/02* | (2006.01) |
| *H01L 29/20* | (2006.01) |

(52) U.S. Cl.
CPC ...... *H01L 29/7787* (2013.01); *H01L 29/66462* (2013.01); *H01L 21/02381* (2013.01); *H01L 21/02458* (2013.01); *H01L 21/02488* (2013.01); *H01L 21/02502* (2013.01); *H01L 21/0254* (2013.01); *H01L 29/2003* (2013.01)
USPC .................. 257/192; 257/E21.403

(58) Field of Classification Search
CPC ............ H01L 29/66462; H01L 29/778; H01L 29/7787; H01L 29/2003; H01L 29/7781; H01L 29/7782; H01L 29/7786; H01L 29/66431; H01L 29/13064
USPC ...... 257/76, 192, E21.09, E21.403, 257/E29.246, E21.409, E29.166
See application file for complete search history.

(56) References Cited

U.S. PATENT DOCUMENTS

| | | | |
|---|---|---|---|
| 5,677,553 A | 10/1997 | Yamamoto et al. | |
| 2007/0072324 A1* | 3/2007 | Krames et al. | 438/46 |
| 2011/0027975 A1* | 2/2011 | Krames et al. | 438/478 |
| 2011/0127540 A1 | 6/2011 | Yamada et al. | |

FOREIGN PATENT DOCUMENTS

| | | |
|---|---|---|
| JP | 07-183493 | 7/1995 |
| JP | 11-274082 | 10/1999 |
| JP | 2002-110569 A1 | 4/2002 |

OTHER PUBLICATIONS

H. Umeda, et al.; "Blocking-Voltage Boosting Technology for GaN Transistors by Widening Depletion Layer in Si Substrates;" IEDM Technical Digest; 2010; pp. 20.5.1-20.5.4 (4 Sheets)/ p. 3 of specification.
The First Office Action, Application No. 201210262740.3. Issuing Date: Sep. 24, 2014. "Compound Semiconductor Device and Method of Manufacturing the Same."

* cited by examiner

*Primary Examiner* — Selim Ahmed
(74) *Attorney, Agent, or Firm* — Kratz, Quintos & Hanson, LLP

(57) ABSTRACT

An embodiment of a compound semiconductor device includes: a Si substrate; a Si oxide layer formed over a surface of the Si substrate; a nucleation layer formed over the Si oxide layer, the nucleation layer exposing a part of the Si oxide layer; and a compound semiconductor stacked structure formed over the Si oxide layer and the nucleation layer.

7 Claims, 10 Drawing Sheets

COMPOUND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2011-203582, filed on Sep. 16, 2011, the entire contents of which are incorporated herein by reference.

FIELD

The embodiments discussed herein are related to a compound semiconductor device and a method of manufacturing the same.

BACKGROUND

In recent years, there has been vigorous development of high-breakdown voltage, high-output compound semiconductor devices, making use of advantages of nitride-based compound semiconductor including high saturation electron mobility and wide band gap. The development is directed to field effect transistors such as high electron mobility transistors (HEMTs), for example. Among them, a GaN-based HEMT having an AlGaN layer as an electron supply layer attracts a lot of attention. In the GaN-based HEMT, lattice distortion occurs in the AlGaN layer due to difference in lattice constants between AlGaN and GaN, the distortion induces piezo polarization therealong, and thereby generates a high-density, two-dimensional electron gas, in the upper portion of the GaN layer laid under the AlGaN layer. This configuration ensures high output.

However, it is very difficult to manufacture a GaN substrate with a good crystallinity. Major conventional solutions have been such as forming a GaN layer, AlGaN layer and so forth by hetero-epitaxial growth, over a Si substrate, sapphire substrate, SiC substrate or the like. In particular as for Si substrate, those having large diameter and high quality are readily available at low costs. Investigations into structures, having a GaN layer and an AlGaN layer formed over the Si substrate, have therefore been flourishing.

Growth of the GaN layer directly on the Si substrate, however, allows Ga and Si to react with each other in the process of growth. Investigations have, therefore, been directed to techniques of forming an AlN layer as a buffer layer, in advance of the growth of the GaN layer.

Formation of the AlN layer directly over the Si substrate, however, degrades the breakdown voltage, due to carriers possibly generated in the vicinity of the interface between the both. In addition, formation of the AlN layer is still insufficient for fully suppressing the reaction between Ga and Si.

[Patent Literature 1] Japanese Laid-Open Patent Publication No. 11-274082

[Patent Literature 2] Japanese Laid-Open Patent Publication No. 2002-110569

[Non-Patent Literature 1] H. Umeda, et al., IEDM Technical digest 2010, pp. 482

SUMMARY

According to an aspect of the embodiments, a compound semiconductor device includes: a Si substrate; a Si oxide layer formed over a surface of the Si substrate; a nucleation layer formed over the Si oxide layer, the nucleation layer exposing a part of the Si oxide layer; and a compound semiconductor stacked structure formed over the Si oxide layer and the nucleation layer.

According to another aspect of the embodiments, a method of manufacturing a compound semiconductor device includes: forming a nucleation layer over a Si substrate; forming an opening in the nucleation layer, a part of the Si substrate being exposed from the opening; oxidizing a surface of the Si substrate through the opening so as to form a Si oxide layer; and forming a compound semiconductor stacked structure over the Si oxide layer and the nucleation layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The present inventor extensively investigated into the reasons why the reaction between Ga and Si is not fully suppressed in prior arts even if an AlN layer is formed in between. Then, it was found out that it is very difficult to densely form the AlN layer over the Si substrate, and that voids are inevitably formed which extend through the AlN layer to reach the Si substrate. The reaction between Ga and Si occurs through the voids, in the process of formation of a layer containing Ga over the AlN layer.

Embodiments will be detailed below, referring to the attached drawings.

(First Embodiment)

Figure 1:
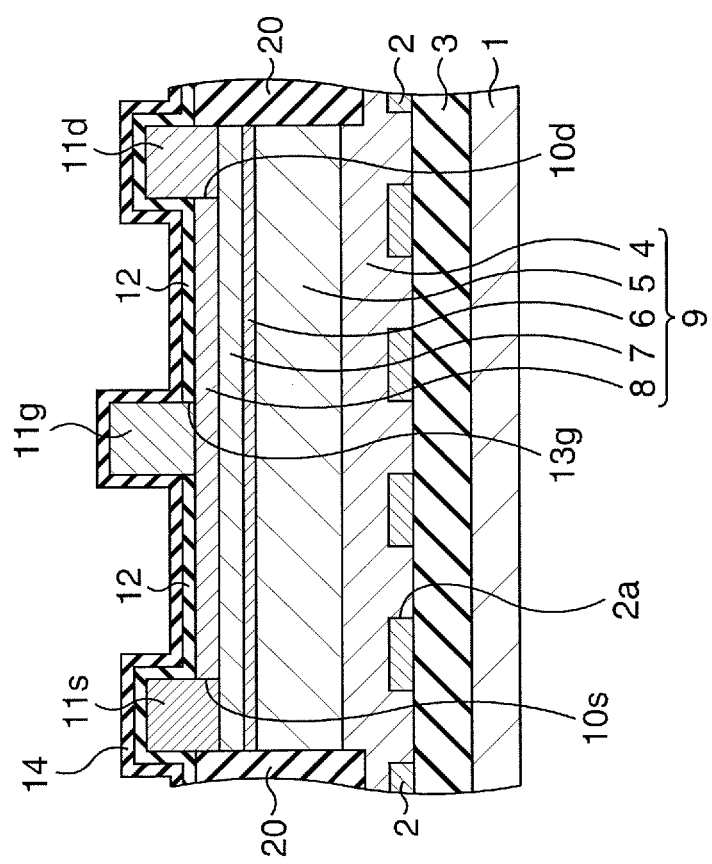
FIG. 1 is a cross sectional view illustrating a structure of a compound semiconductor device according to a first embodiment.

A first embodiment will be described. FIG. 1 is a cross sectional view illustrating a structure of a GaN-based HEMT (compound semiconductor device) according to the first embodiment.

In the first embodiment, as illustrated in FIG. 1, a Si oxide layer 3 is formed over the Si substrate 1. The Si oxide layer 3 is approximately 500 nm thick, for example. An AlN layer 2 is formed over the Si oxide layer 3. The AlN layer 2 is an example of the nucleation layer. The AlN layer 2 is approximately 100 nm, for example. A plurality of openings 2a is formed in the AlN layer. The openings 2a may be formed to give a stripe pattern, for example. In other words, the planar geometry of the AlN layer 2 may be a line-and-space pattern, for example. Both of width of the openings 2a and distance between the adjacent openings 2a are approximately 800 nm, for example.

A compound semiconductor stacked structure 9 is formed over the AlN layer 2 and the Si oxide layer 3. The compound semiconductor stacked structure 9 includes a buffer layer 4, an electron channel layer 5, a spacer layer 6, an electron supply layer 7 and a cap layer 8. The buffer layer 4 may be an AlGaN layer of approximately 300 nm thick, for example. The electron channel layer 5 may be an i-GaN layer of approximately 3 µm thick, which is not intentionally doped with an impurity, for example. The spacer layer 6 may be an i-AlGaN layer of approximately 5 nm, which is not intentionally doped with an impurity, for example. The electron supply layer 7 may be an n-type AlGaN (n-AlGaN) layer of approximately 30 nm thick, for example. The cap layer 8 may be an n-type GaN (n-GaN) layer of approximately 10 nm thick, for example. The electron supply layer 7 and the cap layer 8 may be doped with approximately $5 \times 10^{18}/cm^3$ of Si as an n-type impurity, for example.

An element isolation region 20 which defines an element region is formed in the compound semiconductor stacked structure 9. In the element region, openings 10s and 10d are formed in the cap layer 8. A source electrode 11s is formed in the opening 10s, and a drain electrode 11d is formed in the opening 10d. An insulating film 12 is formed so as to cover the source electrode 11s and the drain electrode 11d over the cap layer 8. An opening 13g is formed in the insulating film 12 at a position in planar view between the source electrode 11s and the drain electrode 11d, and a gate electrode 11g is formed in the opening 13g. An insulating film 14 is formed so as to cover the gate electrode 11g over the insulating film 12. While materials for the insulating films 12 and 14 are not specifically limited, a Si nitride film may be used, for example.

In the GaN-based HEMT thus configured, the Si oxide layer 3 is provided between the AlN layer 2 and the Si substrate 1. Since there is no interface between the AlN layer 2 and the Si substrate 1, unintended generation of carriers can be suppressed, and thereby the breakdown voltage can be suppressed from degrading.

Moreover, with presence of the Si oxide layer 3, it is no longer possible for Ga to reach the Si substrate 1 even if the AlN layer 2 has the voids therein. Accordingly, the reaction between Ga and Si can be sufficiently suppressed.

Next, a method of manufacturing the GaN-based HEMT (compound semiconductor device) according to the first embodiment will be explained. FIG. 2A to FIG. 2J are cross sectional views illustrating, in sequence, the method of manufacturing the GaN-based HEMT (compound semiconductor device) according to the first embodiment.

Figure 2A:
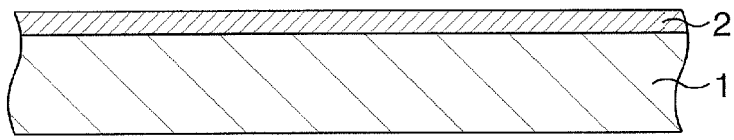
FIGS. 2A to 2J are cross sectional views illustrating, in sequence, a method of manufacturing the compound semiconductor device according to the first embodiment.
Figure 2B:
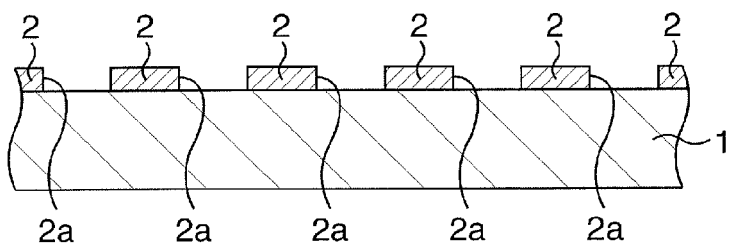
Figure 3:
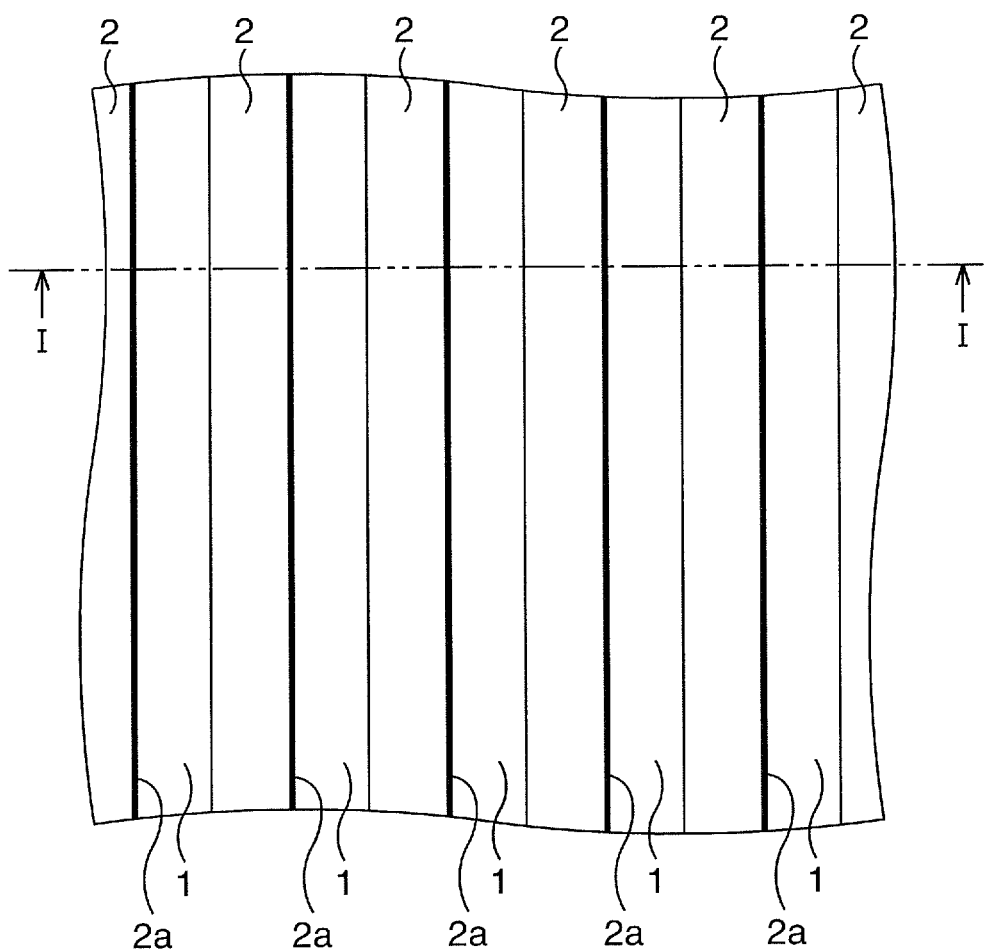
FIG. 3 is a plan view illustrating a state after opening 2a is formed.

First, as illustrated in FIG. 2A, the AlN layer 2 is formed over the Si substrate 1. The AlN layer 2 may be formed by metal organic vapor phase epitaxy (MOVPE), for example. Next, as illustrated FIG. 2A and FIG. 3, a plurality of openings 2a are formed in the AlN layer 2, so as to allow a part of the surface of the Si substrate 1 to expose through the openings 2a. In a process of forming the openings 2a, a photoresist pattern may be formed over the AlN layer 2 so as to expose the regions where the openings 2a are to be formed, and the AlN layer 2 may be etched by dry etching using a chlorine-containing gas, through the photoresist pattern used as an etching mask, for example. FIG. 3 is a plan view illustrating a state after the opening 2a is formed, where a cross section taken along line I-I in FIG. 3 corresponds to FIG. 2B.

Figure 2C:
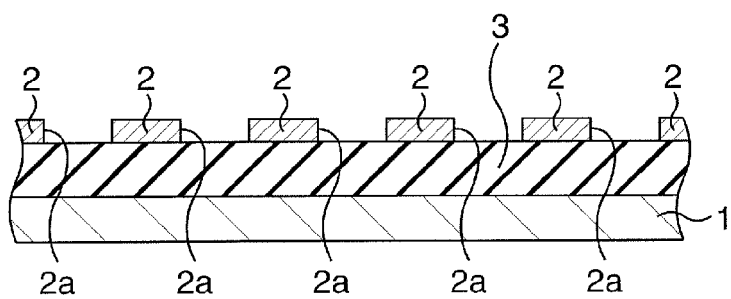

Then annealing is conducted in an oxidative atmosphere. As a result, a surface of the Si substrate 1 is gradually thermally oxidized from portions exposed through the openings 2a. In the process, oxygen gone into the Si substrate 1 diffuses not only in the thickness-wise direction of the Si substrate 1, but also in the direction orthogonal thereto (lateral direction). Accordingly, the thermal oxidation proceeds also below the AlN layer 2. The thermally oxidized regions grown from both sides of the AlN layer 2 meet approximately at the center in the width-wise direction. By allowing the thermal oxidation to proceed in this way, the Si oxide layer 3 is formed over the surface of the Si substrate 1 as illustrated in FIG. 2C. The thickness of the Si oxide layer 3 may be adjusted to a half or more of the width of the line-and-space pattern of the AlN layer 2, for example. More specifically, given that the line-and-space pattern of the AlN layer 2 is 800 nm wide, the Si oxide layer 3 may be adjusted to 500 nm thick or around, for example. As the Si oxide layer 3 grows, the interface between the AlN layer 2 and the Si substrate 1 disappears.

Figure 2D:
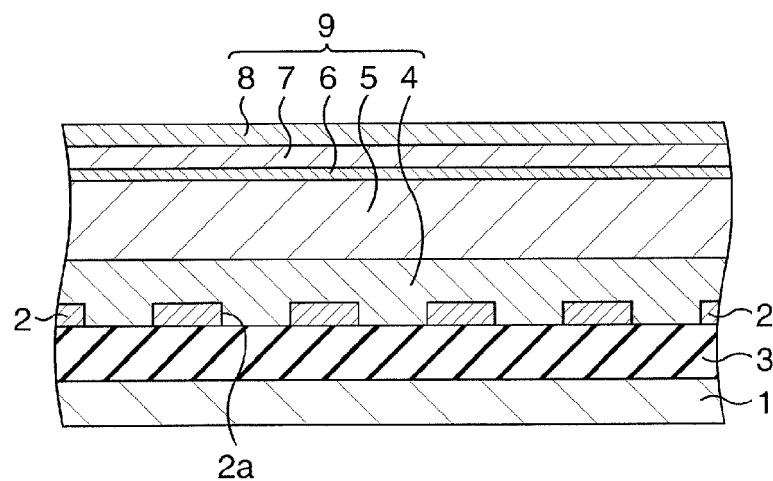

Next, as illustrated in FIG. 2D, the compound semiconductor stacked structure 9 is formed over the AlN layer 2 and the Si oxide layer 3. In the process of forming the compound semiconductor stacked structure 9, the buffer layer 4, the electron channel layer 5, the spacer layer 6, the electron supply layer 7 and the cap layer 8 may be formed by MOVPE, for example. In the process of forming the compound semiconductor layers, a mixed gas of trimethylaluminum (TMA) gas as an Al source, trimethylgallium (TMG) gas as a Ga source, and ammonia ($NH_3$) gas as a N source, may be used. In the process, on/off of supply and flow rates of trimethylaluminum gas and trimethylgallium gas are appropriately set, depending on compositions of the compound semiconductor layers to be grown. Flow rate of ammonia gas, which is common to all compound semiconductor layers, may be set to approximately 100 ccm to 10 LM. Growth pressure may be adjusted to approximately 50 Torr to 300 Torr, and growth temperature may be adjusted to approximately 1000° C. to 1200° C., for example. In the process of growing the n-type compound semiconductor layers, Si may be doped into the compound semiconductor layers by adding $SiH_4$ gas, which contains Si, to a mixed gas at a predetermined flow rate, for example. Dose of Si is adjusted to approximately $1 \times 10^{18}/cm^3$ to $1 \times 10^{20}/cm^3$, and to $5 \times 10^{18}/cm^3$ or around, for example.

Figure 2E:
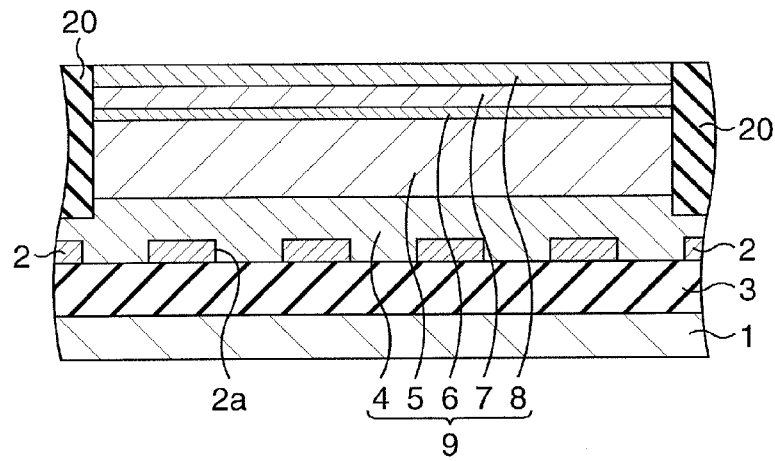

Next, as illustrated in FIG. 2E, the element isolation region 20 which defines the element region is formed in the compound semiconductor stacked structure 9. In the process of forming the element isolation region 20, for example, a photoresist pattern is formed over the compound semiconductor stacked structure 9 so as to selectively expose region where the element isolation region 20 is to be formed, and ion such as Ar ion is implanted through the photoresist pattern used as a mask. Alternatively, the compound semiconductor stacked structure 9 may be etched by dry etching using a chlorine-containing gas, through the photoresist pattern used as an etching mask.

Figure 2F:
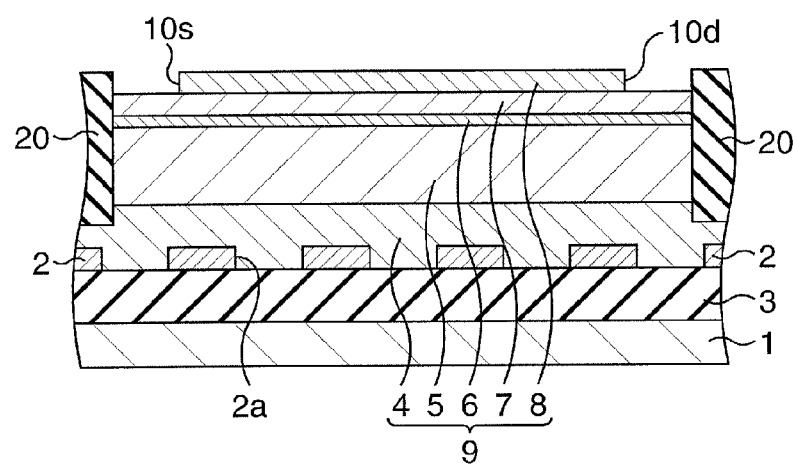

Thereafter, as illustrated in FIG. 2F, the openings 10s and 10d are formed in the cap layer 8 in the element region. In the process of forming the openings 10s and 10d, for example, a photoresist pattern is formed over the compound semiconductor stacked structure 9 so as to expose regions where the openings 10s and 10d are to be formed, and the cap layer 8 is etched by dry etching using a chlorine-containing gas, through the photoresist pattern used as an etching mask.

Figure 2G:
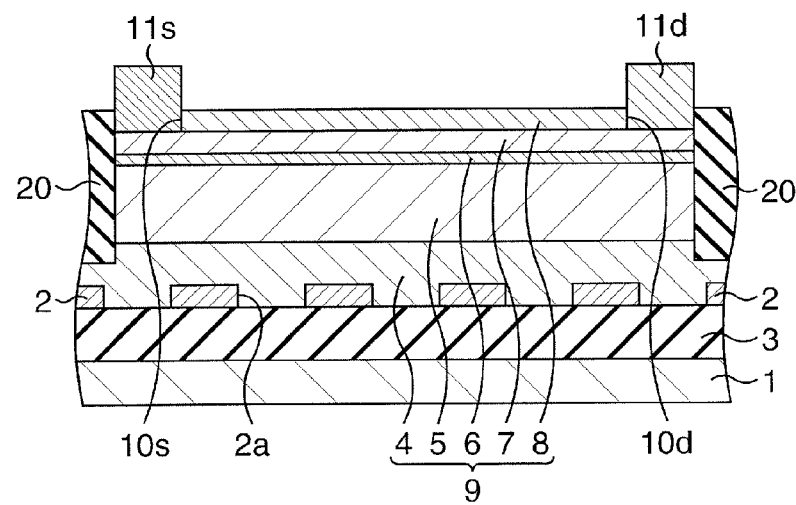

Next, as illustrated in FIG. 2G, the source electrode 11s is formed in the opening 10s, and the drain electrode 11d is formed in the opening 10d. The source electrode 11s and the drain electrode 11d may be formed by a lift-off process, for example. More specifically, a photoresist pattern is formed so as to expose regions where the source electrode 11s and the drain electrode 11d are to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ta film of approximately 20 nm thick may be formed, and an Al film of approximately 200 nm thick may be then formed. The metal film is then annealed, for example, in a nitrogen atmosphere at 400° C. to 1000° C. (at 550° C., for example) to thereby ensure the ohmic characteristic.

Figure 2H:
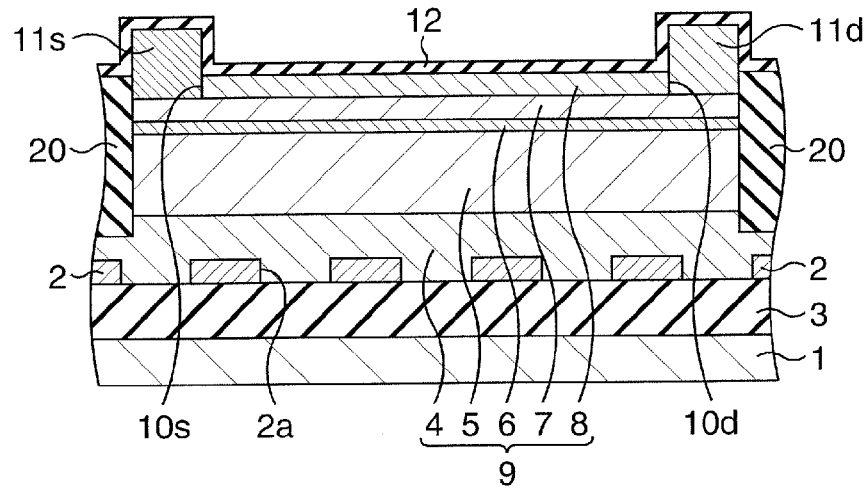

Then as illustrated in FIG. 2H, the insulating film 12 is formed over the entire surface. The insulating film 12 is preferably formed by atomic layer deposition (ALD), plasma-assisted chemical vapor deposition (CVD), or sputtering.

Figure 2I:
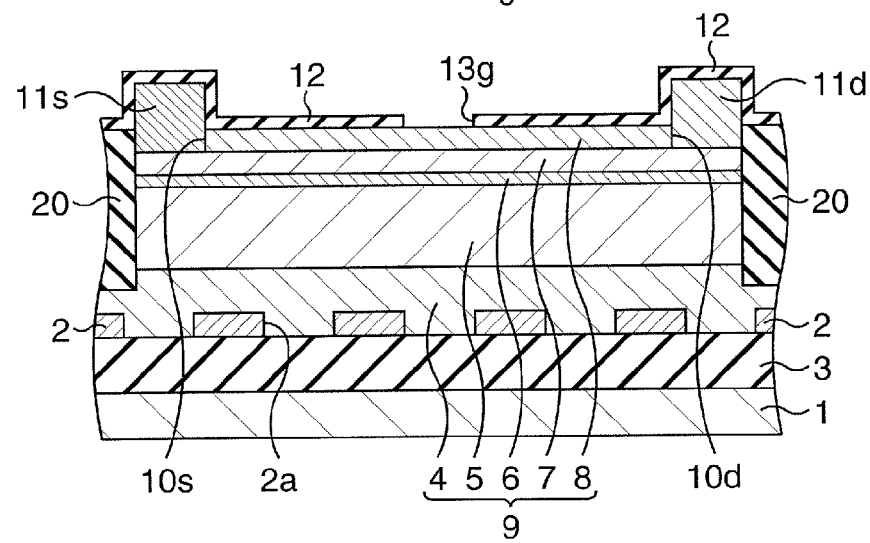

Next, as illustrated in FIG. 2I, the opening 13g is formed in the insulating film 12 at a position in planar view between the source electrode 11s and the drain electrode 11d.

Figure 2J:
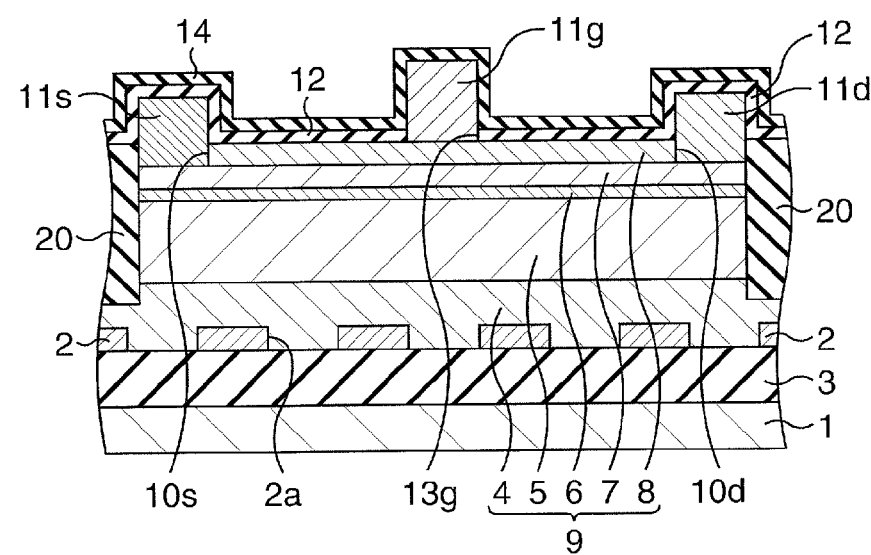

Next, as illustrated in FIG. 2J, the gate electrode 11g is formed in the opening 13g. The gate electrode 11g may be formed by a lift-off process, for example. More specifically, a photoresist pattern is formed so as to expose a region where the gate electrode 11g is to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ni film of approximately 30 nm thick may be formed, and a Au film of approximately 400 nm thick may be then formed. Thereafter, the insulating film 14 is formed over the insulating film 12 so as to cover the gate electrode 11g.

The GaN-based HEMT according to the first embodiment may be thus manufactured.

While the pattern of the AlN layer 2 is not specifically limited, the line-and-space pattern as described above is preferable, because of readiness of patterning of the AlN layer 2 per se, and readiness of formation of the Si oxide layer 3. The thickness of the Si oxide layer 3 is not specifically limited, so long as the Si oxide layer 3 is thick enough to conceal the interface between the AlN layer 2 and the Si substrate 1. The thickness of the Si oxide layer is preferably 10 nm or larger, more preferably 20 nm or larger, and still more preferably 30 nm or larger, at a thinnest portion. This is because a too small thickness of the Si oxide layer 3 may induce carriers in the vicinity of the surface of the Si substrate 1, while the amount thereof might be very small. Since the thermal oxidation proceeds from the portions exposed in the openings 2a of the AlN layer 2, the thinnest portions of the Si oxide layer 3 reside below the residual portions of the AlN layer 2. In other words, the portions of the Si oxide layer 3 located below the residual portions of the AlN layer 2 may be thinner than the portion located below the openings 2a.

(Second Embodiment)

Figure 4:
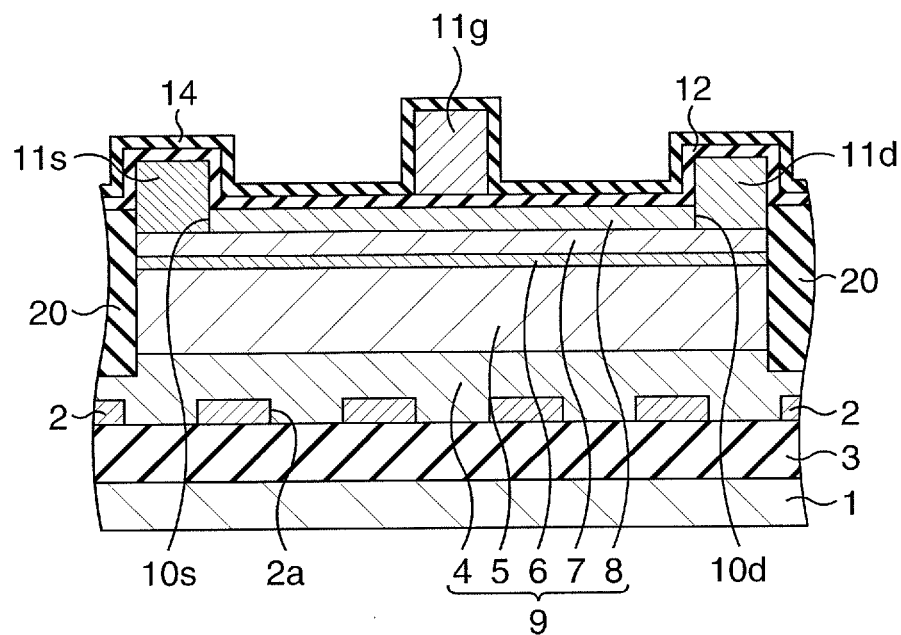
FIG. 4 is a cross sectional view illustrating a structure of a compound semiconductor device according to a second embodiment.

Next, a second embodiment will be explained. FIG. 4 is a cross sectional view illustrating a structure of a GaN-based HEMT (compound semiconductor device) according to the second embodiment.

In contrast to the first embodiment, having the gate electrode 11g brought into Schottky contact with the compound semiconductor stacked structure 9, the second embodiment adopts the insulating film 12 between the gate electrode 11g and the compound semiconductor stacked structure 9, so as to allow the insulating film 12 to function as a gate insulating film. In short, the opening 13g is not formed in the insulating film 12, and a MIS-type structure is adopted.

Also the second embodiment thus configured successfully achieves, similarly to the first embodiment, the effects of improving the breakdown voltage and suppressing the reaction between Ga and Si, with the presence of the Si oxide layer 3.

A Material for the insulating film 12 is not specifically limited, wherein the preferable examples include oxide, nitride or oxynitride of Si, Al, Hf, Zr, Ti, Ta and W. Aluminum oxide is particularly preferable. Thickness of the insulating film 12 may be 2 nm to 200 nm, and 10 nm or around, for example.

(Third Embodiment)

Figure 5:
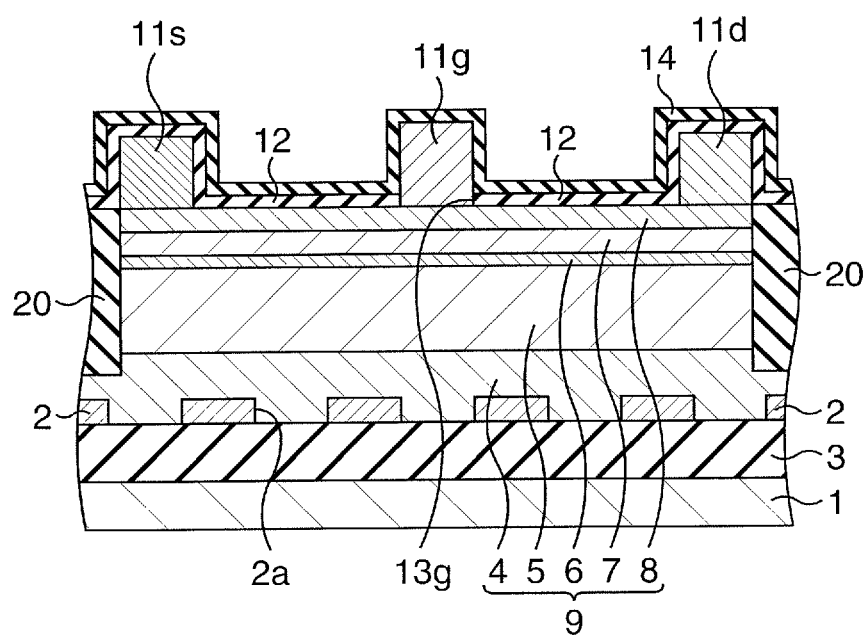
FIG. 5 is a cross sectional view illustrating a structure of a compound semiconductor device according to a third embodiment.

Next, a third embodiment will be explained. FIG. 5 is a cross sectional view illustrating a structure of a GaN-based HEMT (compound semiconductor device) according to the third embodiment.

In contrast to the first embodiment, having the source electrode 11s and the drain electrode 11d formed in the openings 10s and 10d respectively, the openings 10s and 10d are not formed in the third embodiment. The source electrode 11s and the drain electrode 11d are formed on the cap layer 8.

Also the third embodiment thus configured successfully achieves, similarly to the first embodiment, the effects of improving the breakdown voltage and suppressing the reaction between Ga and Si, with the presence of the Si oxide layer 3.

(Fourth Embodiment)

Figure 6:
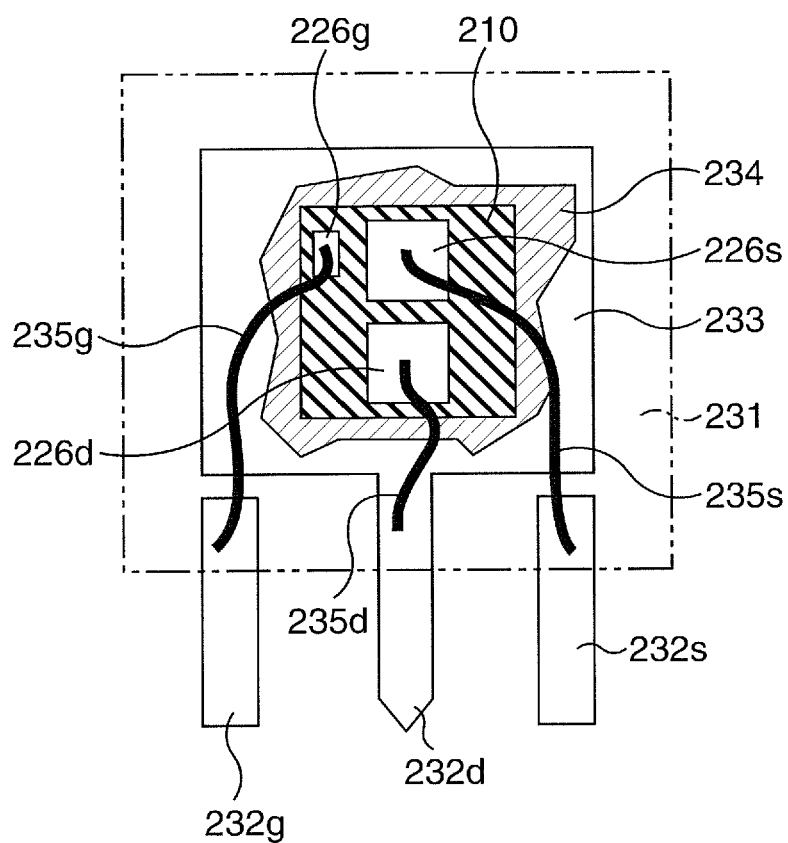
FIG. 6 is a drawing illustrating a discrete package according to a fourth embodiment.

A fourth embodiment relates to a discrete package of a compound semiconductor device which includes a GaN-based HEMT. FIG. 6 is a drawing illustrating the discrete package according to the fourth embodiment.

In the fourth embodiment, as illustrated in FIG. 6, a back surface of a HEMT chip 210 of the compound semiconductor device according to any one of the first to third embodiments is fixed on a land (die pad) 233, using a die attaching agent 234 such as solder. One end of a wire 235d such as an Al wire is bonded to a drain pad 226d, to which the drain electrode 11d is connected, and the other end of the wire 235d is bonded to a drain lead 232d integral with the land 233. One end of a wire 235s such as an Al wire is bonded to a source pad 226s, to which the source electrode 11s is connected, and the other end of the wire 235s is bonded to a source lead 232s separated from the land 233. One end of a wire 235g such as an Al wire is bonded to a gate pad 226g, to which the gate electrode 11g is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. Then molding with the molding resin 231 is conducted by a transfer molding process. The lead frame is then cut away.

(Fifth Embodiment)

Figure 7:
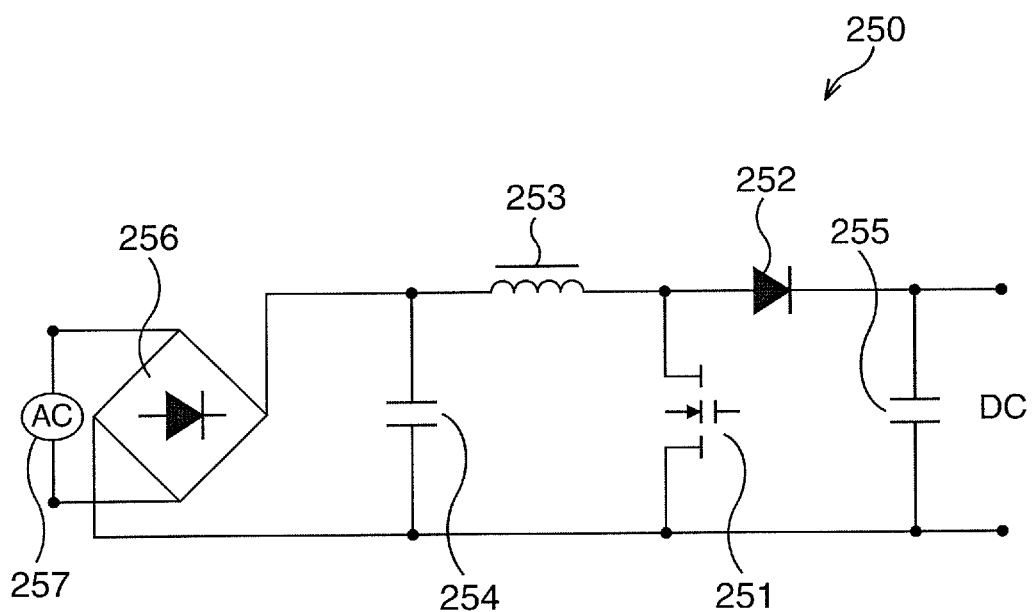
FIG. 7 is a wiring diagram illustrating a power factor correction (PFC) circuit according to a fifth embodiment.

Next, a fifth embodiment will be explained. The fifth embodiment relates to a PFC (power factor correction) circuit equipped with a compound semiconductor device which includes a GaN-based HEMT. FIG. 7 is a wiring diagram illustrating the PFC circuit according to the fifth embodiment.

The PFC circuit 250 includes a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to third embodiments is used as the switching element 251.

In the process of manufacturing the PFC circuit 250, for example, the switching element 251 is connected to the diode 252, the choke coil 253 and so forth with solder, for example.

(Sixth Embodiment)

Figure 8:
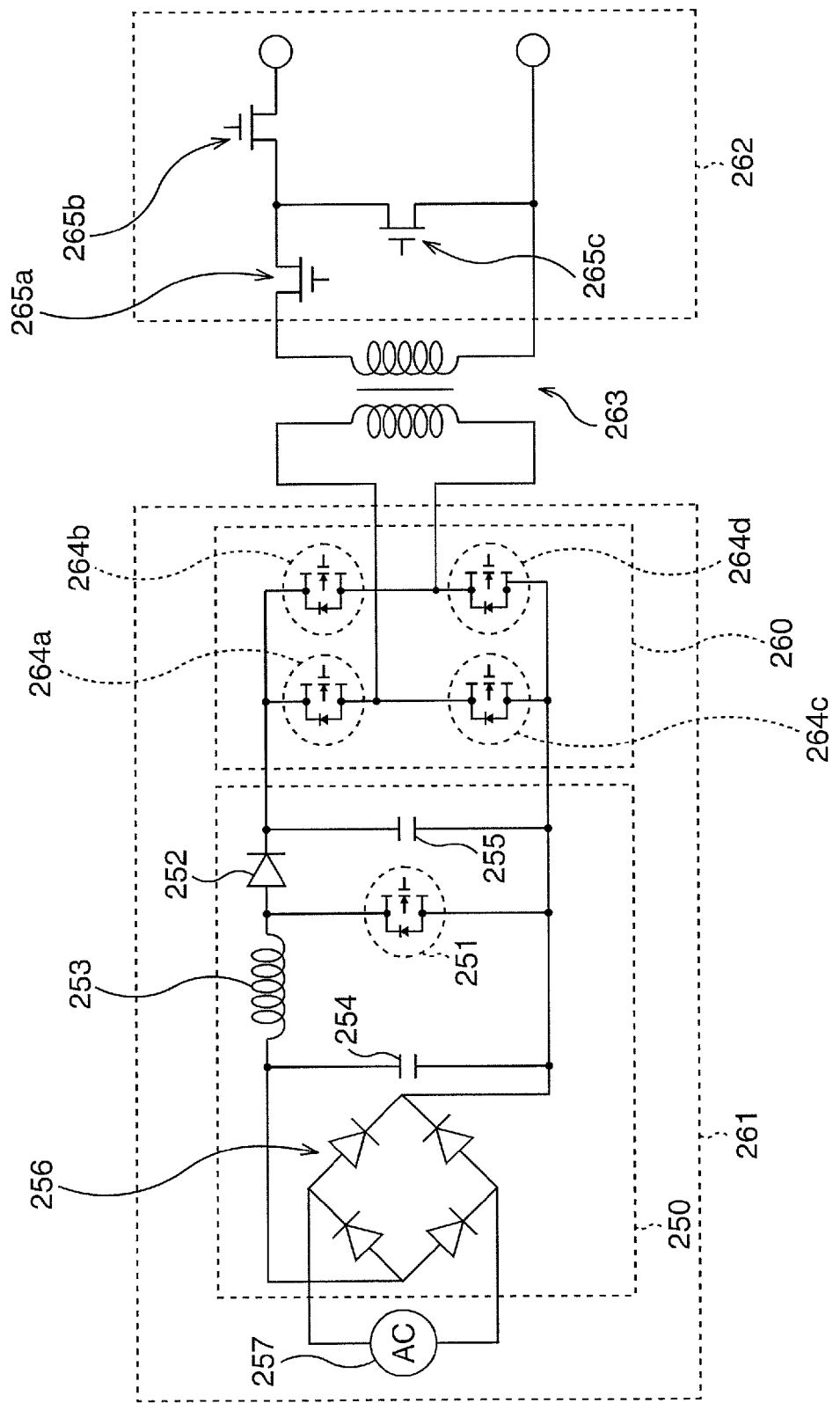
FIG. 8 is a wiring diagram illustrating a power supply apparatus according to a sixth embodiment.

Next, a sixth embodiment will be explained. The sixth embodiment relates to a power supply apparatus equipped with a compound semiconductor device which includes a GaN-based HEMT. FIG. 8 is a wiring diagram illustrating the power supply apparatus according to the sixth embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the fifth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of first to third embodiments is used for the switching element 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

(Seventh Embodiment)

Figure 9:
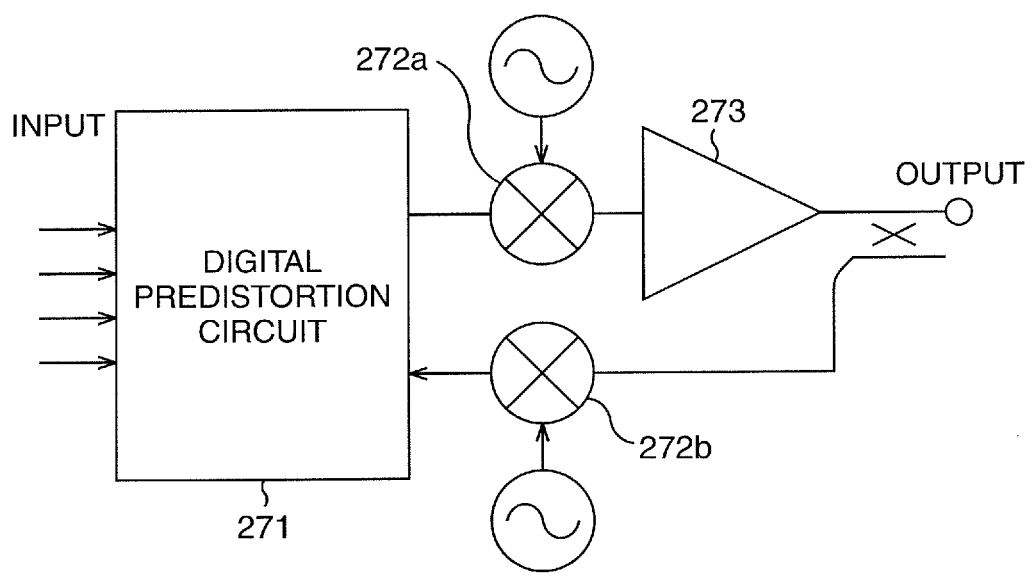
FIG. 9 is a wiring diagram illustrating a high-frequency amplifier according to a seventh embodiment.

Next, a seventh embodiment will be explained. The seventh embodiment relates to a high-frequency amplifier equipped with a compound semiconductor device which includes a GaN-based HEMT. FIG. 9 is a wiring diagram illustrating the high-frequency amplifier according to the seventh embodiment.

The high-frequency amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to third embodiments, and amplifies the input signal mixed with the AC signal. In the illustrated example of the embodiment, the signal on the output side may be mixed, upon switching, with an AC signal by the mixer 272b, and may be sent back to the digital predistortion circuit 271.

Composition of the compound semiconductor layers used for the compound semiconductor stacked structure is not specifically limited, and GaN, AlN, InN and so forth may be used. Also mixed crystals of them may be used.

In the embodiments, the substrate may be a silicon carbide (SiC) substrate, a sapphire substrate, a silicon substrate, a GaN substrate, a GaAs substrate or the like. The substrate may be any of electro-conductive, semi-insulating, and insulating ones.

Configurations of the gate electrode, the source electrode and the drain electrode are not limited to those in the above-described embodiments. For example, they may be configured by a single layer. The method of forming these electrodes is not limited to the lift-off process. The annealing after the formation of the source electrode and the drain electrode may be omissible, so long as the ohmic characteristic is obtainable. The gate electrode may be annealed.

The thickness and materials for composing the individual layers are not limited to those described in the embodiments.

According to the compound semiconductor devices and so forth described above, the reaction between Si and Ga can be suppressed, with the presence of the Si oxide layer, even if the compound semiconductor stacked structure contains Ga.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a Si substrate;
a Si oxide layer formed over a surface of the Si substrate;
a nucleation layer in direct contact with the Si oxide layer, the nucleation layer exposing a part of the Si oxide layer; and
a compound semiconductor stacked structure formed over the Si oxide layer and the nucleation layer,
wherein the nucleation layer is an AlN layer, and
the compound semiconductor stacked structure is in direct contact with the part of the Si oxide layer.

2. A compound semiconductor device, comprising:
a Si substrate;
a Si oxide layer formed over a surface of the Si substrate;
a nucleation layer formed over the Si oxide layer, the nucleation layer exposing a part of the Si oxide layer; and a compound semiconductor stacked structure formed over the Si oxide layer and the nucleation layer,
wherein the compound semiconductor stacked structure comprises:
an electron channel layer; and
an electron supply layer formed over the electron channel layer.

3. The compound semiconductor device according to claim 2, further comprising a gate electrode, a source electrode and a drain electrode formed on or above the electron supply layer.

4. The compound semiconductor device according to claim 1, wherein a thickness of the Si oxide layer is at least 10 nm at a thinnest portion.

5. A compound semiconductor device, comprising:
a Si substrate;
a Si oxide layer formed over a surface of the Si substrate;
a nucleation layer formed over the Si oxide layer, the nucleation layer exposing a part of the Si oxide layer; and
a compound semiconductor stacked structure formed over the Si oxide layer and the nucleation layer,
wherein the nucleation layer linearly extends in planar view at a plurality of positions on the Si oxide layer.

6. A power supply apparatus, comprising
a compound semiconductor device, which comprises:
a Si substrate;
a Si oxide layer formed over a surface of the Si substrate;
a nucleation layer in direct contact with the Si oxide layer, the nucleation layer exposing a part of the Si oxide layer; and
a compound semiconductor stacked structure formed over the Si oxide layer and the nucleation layer,
wherein the nucleation layer is an AlN layer, and
the compound semiconductor stacked structure is in direct contact with the part of the Si oxide layer.

7. An amplifier comprising
a compound semiconductor device, which comprises:
a Si substrate;
a Si oxide layer formed over a surface of the Si substrate;
a nucleation layer in direct contact with the Si oxide layer, the nucleation layer exposing a part of the Si oxide layer; and
a compound semiconductor stacked structure formed over the Si oxide layer and the nucleation layer,
wherein the nucleation layer is an AlN layer, and the compound semiconductor stacked structure is in direct contact with the part of the Si oxide layer.

* * * * *